(12) United States Patent
Grilletto et al.

(10) Patent No.: US 7,528,616 B2
(45) Date of Patent: May 5, 2009

(54) ZERO ATE INSERTION FORCE INTERPOSER DAUGHTER CARD

(75) Inventors: Carlo Grilletto, San Carlos, CA (US); Zafer S. Kutlu, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 329 days.

(21) Appl. No.: 11/140,455

(22) Filed: May 27, 2005

(65) Prior Publication Data

US 2006/0267615 A1  Nov. 30, 2006

(51) Int. Cl.
G01R 31/02 (2006.01)
(52) U.S. Cl. .................... 324/754; 324/755
(58) Field of Classification Search .............. None
See application file for complete search history.

(56) References Cited

U.S. PATENT DOCUMENTS

| | | | | |
|---|---|---|---|---|
| 3,800,097 A * | 3/1974 | Maruscak et al. | ............ | 361/791 |
| 4,994,735 A * | 2/1991 | Leedy | ................ | 324/754 |
| 5,205,741 A * | 4/1993 | Steen et al. | ............ | 439/70 |
| 5,266,059 A * | 11/1993 | Taylor | ................ | 439/70 |
| 5,764,071 A * | 6/1998 | Chan et al. | ............ | 324/754 |
| 6,211,690 B1 * | 4/2001 | Fjelstad | ............ | 324/761 |
| 6,344,752 B1 * | 2/2002 | Hagihara et al. | ............ | 324/754 |
| 6,452,807 B1 * | 9/2002 | Barrett | ............ | 361/767 |
| 6,462,570 B1 * | 10/2002 | Price et al. | ............ | 324/754 |
| 6,525,551 B1 * | 2/2003 | Beaman et al. | ............ | 324/754 |
| 6,597,189 B1 * | 7/2003 | Grilletto | ............ | 324/755 |
| 6,771,085 B2 * | 8/2004 | Grilletto | ............ | 324/756 |
| 6,880,245 B2 * | 4/2005 | Beaman et al. | ............ | 29/884 |
| 6,900,649 B1 * | 5/2005 | Knauer | ............ | 324/758 |
| 6,954,082 B2 * | 10/2005 | Grillette | ............ | 324/765 |
| 6,977,515 B2 * | 12/2005 | McQuade et al. | ............ | 324/754 |
| 6,999,888 B2 * | 2/2006 | Repko et al. | ............ | 702/120 |
| 7,061,122 B2 * | 6/2006 | Kim et al. | ............ | 257/778 |
| 7,098,680 B2 * | 8/2006 | Fukushima et al. | ............ | 324/763 |
| 2004/0262777 A1 * | 12/2004 | Kim et al. | ............ | 257/778 |

* cited by examiner

*Primary Examiner*—Paresh Patel
(74) *Attorney, Agent, or Firm*—Strategic Patent Group P.C.

(57) ABSTRACT

A zero automated electrical testing (ATE) interposer daughter card (IDC) is provided for use in a test apparatus for ATE. Embodiments of the IDC include a first side having a first set of pads for mounting I/O's of a test package; and a second side having a second set of pads coupled to the first set of pads for replicating the first set of pads, wherein the second set of pads is located in area of the interposer card horizontally offset from the first set of pads, such that ATE measurements are obtained by removably inserting only a portion of the interposer card containing the second set of pads into an ATE test socket.

5 Claims, 3 Drawing Sheets

ZERO ATE INSERTION FORCE INTERPOSER DAUGHTER CARD

CROSS-REFERENCE TO RELATED APPLICATIONS

The present application is related to U.S. Pat. No. 6,597,189 issued on Jul. 22, 2003; U.S. Pat. No. 6,771,085 issued on Aug. 3, 2004; and U.S. Pat. No. 6,954,082 issued on Oct. 11, 2005, assigned to the assignee of the present application, and herein incorporated by reference.

FIELD OF THE INVENTION

The present invention relates to methods for testing integrated circuits, and more particularly to a zero ATE insertion force interposer daughter card used for ATE testing integrated circuits.

BACKGROUND OF THE INVENTION

Integrated circuits (ICs) are enclosed within IC "packages." The IC packages generally include a housing and external pads, connectors, leads or pins on outside edges or an outside surface of the housing. The external connectors are electrically connected to connection pads on IC dies for transferring electrical signals between the enclosed ICs and external components or devices with which the ICs interact. The IC packages are generally mounted on printed wiring boards (a.k.a. motherboards, printed circuit boards, etc.)

IC package designs differ based on a variety of characteristics, such as size, arrangement of external connectors and materials of construction, among many other characteristics. Each IC package must be appropriate for the enclosed IC, depending on IC characteristics such as die size, number of connection pads and amount of heat generated during operation of the chip, among other characteristics.

When a new IC or new IC package is developed, the package or IC/package combination must undergo testing to qualify the IC package to be used in a wide range of conditions. Additionally, particularly for surface-mounted IC packages, the IC package is tested when mounted on a representative circuit board that physically simulates the types of printed wiring boards on which the IC package may be mounted. Such testing is necessary because the internal and external stresses and strains on a board-mounted IC package are different from a free-standing, or un-mounted, IC package. For example, it is important to determine the reliability of the "attach system" (i.e. solder balls, etc.) to the printed wiring board. Also, the stresses on the IC die mounted within the IC package are different when the IC package is board-mounted compared to when the IC package is free-standing.

Tests that focus on the reliability or function of the connection between the IC package and the printed wiring board are commonly referred to as "second-level" tests. On the other hand, tests that focus on internal portions of the IC package are commonly referred to as "first-level" tests. However, the second-level tests commonly involve a combination of first-level and second-level issues, since the attached printed wiring board can affect the IC die and other internal components of the IC package and the electrical signals applied to the external connectors must pass into the IC package to the IC die and back to the external connectors.

The second-level tests generally involve variations in electrical signal bias, ambient temperature, ambient humidity, etc. One commonly performed second-level IC package test is a thermal cycling test defined by IPC-9701, "Performance Test Methods and Qualification Requirements for Surface Mount Solder Attachments," by IPC—Association Connecting Electronics Industries of Northbrook, Ill. Another type of second-level test is an electrical bias test commonly known as a highly accelerated stress test (HAST).

The IPC-9701 test generally subjects the surface-mounted IC package to thermal cycling conditions while electrical signals are supplied to the IC package. The electrical signals are monitored for failure conditions, such as an unacceptable increase in electrical resistance at any given temperature (e.g. −0° C. to +100° C.), which may occur due to thermal expansion and/or contraction of any portion of the IC package. Manual testing then determines the location of the failure condition. In a more practical and new approach the resistances are monitored at fixed intervals during a test consisting of 3500 cycles of −0° C. to +100° C.

The aforementioned HAST test generally subjects the IC packages to electrical bias testing in a relatively harsh environment (e.g. about 130° C. and about 85% relative humidity) to stress the IC packages to accelerate any potential electro-chemical problems. The IC packages are placed in relatively expensive sockets that are mounted on a relatively expensive motherboard, and the populated motherboard is placed in a HAST test chamber. The IC packages are thus stressed in the test chamber for a period of time (e.g. about 100 hours). Then the populated motherboard is removed from the test chamber, and the IC packages are removed from the sockets. The IC packages are then connected to an Automated Test Equipment (ATE) and tested to locate any failure condition(s) that may have been caused by the electrical bias stressing.

An improvement to this test apparatus and method is described in U.S. Pat. 6,597,189, filed Nov. 27, 2002 and issued Jul. 22, 2003 to the same inventor and assigned to the same assignee as the present invention. U.S. Pat. 6,597,189 describes a socketless test apparatus and method using test interposer cards on which the IC packages are mounted and which is an improvement over the socket-based tests. The test interposer cards are appropriate printed wiring boards for testing the IC packages in a board-mounted situation.

However, even with the improved interposer cards described above, one of the main disadvantages of ATE of accelerated reliability stressed packaged devices is that in order to place a test package in an ATE test socket, an ATE clamp is used to hold the test package in place and to make good electrical contact between the packaged and the ATE socket. This total force can exceed 100+ lbs. Should the test package may have a broken electrical connection on the second-level, i.e., between the test package and the test interposer card, then the force applied to the top of the test package may falsely mask the broken electrical connection. This is particularly a concern for the evaluation of second order (Device to Board) connections where the BGA connections are the main focus. The force can also cause device to board warpage, thereby placing undue strain on the connections and consequently causing false opens.

In addition, it would be desirable to perform second level testing of an active device contained in the test package. There is no known current methodology to ATE test second reliability of an active device. All the current tests are performed with a Daisy Chain device. Development of a Daisy Chain die is a costly and timely task.

Accordingly, what is needed is an improved method and system for performing second level testing on integrated circuit packages.

SUMMARY OF THE INVENTION

The present invention provides a zero automated electrical testing (ATE) interposer daughter card (IDC) for use in a test apparatus for ATE. Embodiments of the IDC include a first side having a first set of pads for mounting I/O's of a test package; and a second side having a second set of pads coupled to the first set of pads for replicating the first set of pads, wherein the second set of pads is located in area of the interposer card horizontally offset from the first set of pads, such that ATE measurements are obtained by removably inserting only a portion of the interposer card containing the second set of pads into an ATE test socket.

According to the system and method disclosed herein, by only inserting the offset area of the IDC in an ATE socket, the test package-to-IDC connections are left suspended in air and undisturbed by the socket clamp force. Instead, the pressure is asserted on the IDC over the offset area, which has no bearing on the reliability of the test package-to-IDC connections.

DETAILED DESCRIPTION

The present invention relates to techniques for performing second-level tests on integrated circuit packages, such as flip-chip BGA packages. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The same inventor and same assignee of the present invention have developed a concept of ATE testing devices that are attached to a PCB directly by using an Interposer Daughter Card (IDC), as disclosed in U.S. Pat. No. 6,597,189 issued on Jul. 22, 2003; U.S. Pat. No. 6,771,085 issued on Aug. 3, 2004; and co-pending patent application Ser. No. 10/727,474 filed on Dec. 4, 2003. In order to take full advantage of this for second level testing, the present invention provides an adaptation the interposer daughter card (IDC) for testing integrated circuit packages (hereinafter test packages) that will be able to ATE test not only simple daisy chain devices but also an active die.

In accordance with a preferred embodiment, the IDC of the present invention is provided with an area for connecting a test package and an offset area that duplicates the area for connecting the test package. When the IDC of the present invention is to be tested in an ATE, only the offset area of the IDC is inserted in an ATE socket to prevent pressure from the socket being asserted on the test package-to-IDC connections, which is left suspended in air and undisturbed by the socket clamp force. Instead, the pressure is asserted on the IDC over the offset area, which has no bearing on the reliability of the test package-to-IDC connections.

Although the present invention will be described in terms of a preferred embodiment in which a BGA Flip Chip package is attached to the IDC of the present invention, those with ordinary skill in the art will recognize that any type of integrated circuit package may be attached to the IDC and still remain within the scope of the present invention.

Figure 1:
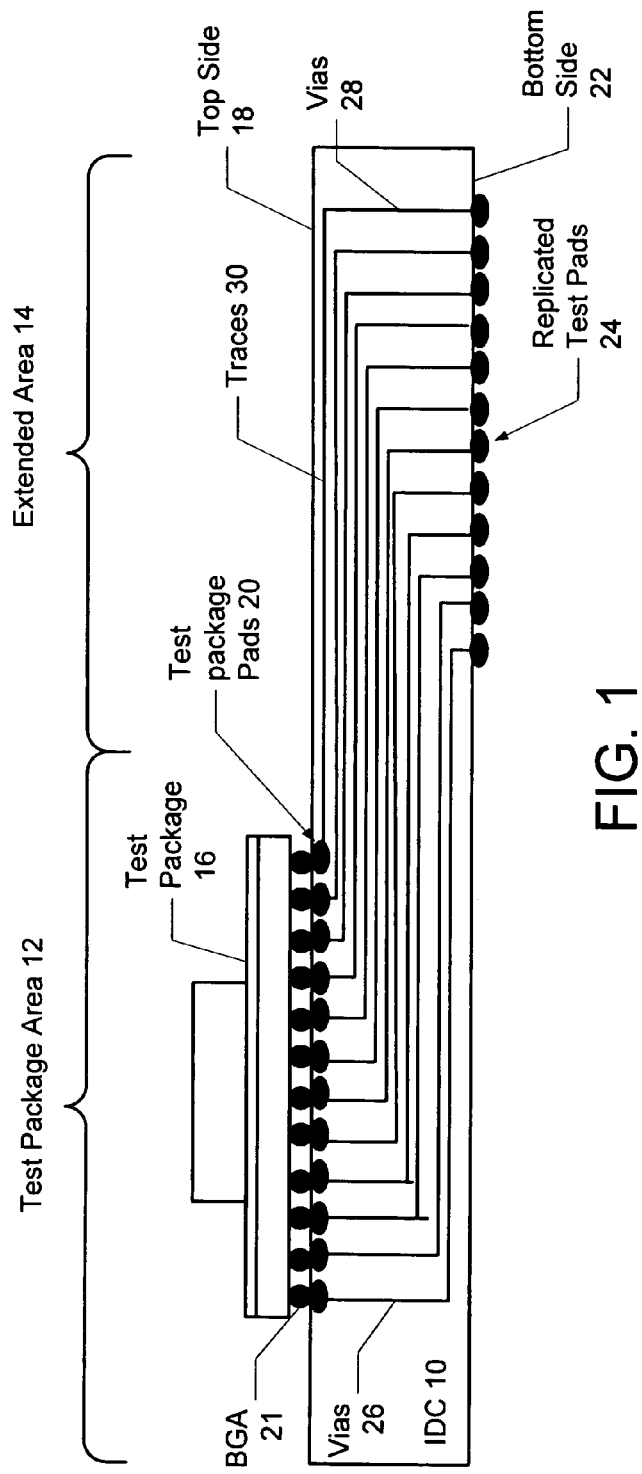
FIG. 1 is a cross-sectional view of a zero ATE insertion-force interposer daughter card (IDC) for use in a test apparatus for automated electrical testing (ATE).

FIG. 1 is a cross-sectional view of a zero ATE insertion-force interposer daughter card (IDC) for use in a test apparatus for automated electrical testing (ATE). According to the preferred embodiment, the IDC 10 is provided with a test package area 12 for surface mounting a test package 16, and an extended area 14 adjacent to the test package area 12 for removably inserting the IDC 10 into an ATE test socket (not shown). The zero ATE insertion force IDC 10 can be manufactured to meet the mechanical requirements of various types of print circuit board (PCB) designs (material, thickness, number of layers, etc) for testing various types of active integrated circuits.

Figure 2:
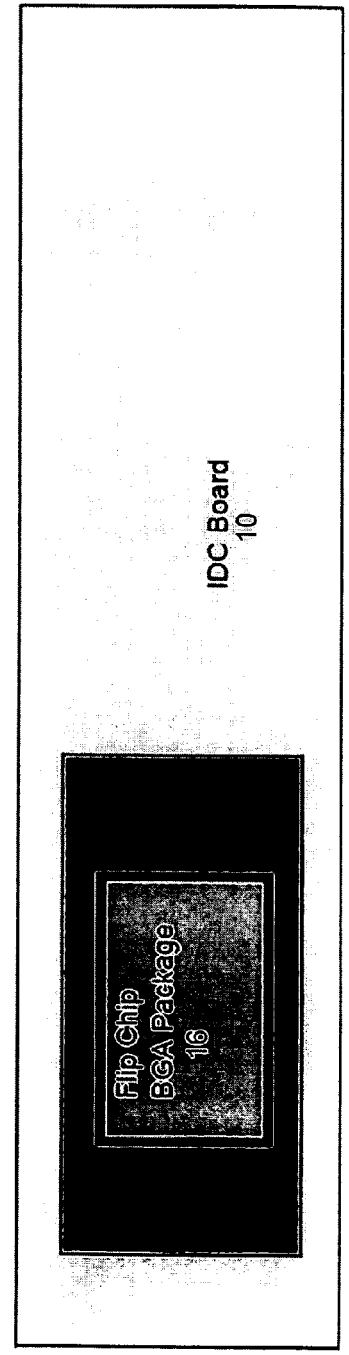
FIG. 2 is a diagram illustrating a top view of the top side 18 of the IDC 10 in an exemplary embodiment where a flip-chip BGA package is surface mounted to the IDC 10.

The top side 18 of the IDC 10 in the test package area 12 preferably includes a predefined number of individual female connectors, referred to as a set of test package pads 20, for surface mounting I/O's of the test package 16. In a preferred embodiment, the test package 16 is a BGA package. The test package pads 20 are therefore a type suitable for receiving the balls 21 of the BGA package 22. The balls of the BGA package are preferably attached, in the exact same manner used for the production PCB attachment, to the test package pads 20 with solder. FIG. 2 is a diagram illustrating a top view of the top side 18 of the IDC 10 in an exemplary embodiment where a flip-chip BGA package 16 is surface mounted to the IDC 10.

Referring again to FIG. 1, according to the preferred embodiment, the bottom side 22 of the IDC 10 in the extended area 14 includes a set of replicated test pads 24 for replicating the test package pads 20. The IDC 10 further includes traces 30 located between the top and bottom sides 18 and 22 of the IDC 10 for coupling the test package pads 20 to the replicated test package pads 24. In a preferred embodiment, the traces 30 are coupled between a set of test package vias 26, which are coupled to respective test package pads 24, and a set of replicated vias 28, which are coupled to respective replicated test pads 24. The pads 24 on the bottom side 22 effectively replicate the test package I/Os for connecting the IDC 10 (and therefore the test package 16) directly to an ATE tester.

After the test package 16 is mounted onto the test package pads 20, ATE measurements for the test package 16 are then obtained. This is accomplished by removably inserting the extended area 14 into the ATE test apparatus so that the set of replicated test pads 24 mate with the ATE test socket. An ATE test socket clamp rests on the top side 18 of the extended area 14 to hold the IDC in place. Notice that because the set of replicated test pads 24 is horizontally offset from the test package area of 12 of the IDC 10, the test package area 12 is left suspended in air and not disturbed by the force imparted by the ATE test socket clamp. ATE measurements are made with the set of replicated test pads 24, which is not sensitive to clamp force. In addition, it is typically desirable to perform ATE at 100° C. and 0° C. This is now relatively easier to do since the test package 16 is extended away from the ATE socket and easier to reach via a gooseneck heater/cooler for heating and cooling.

Figure 3:
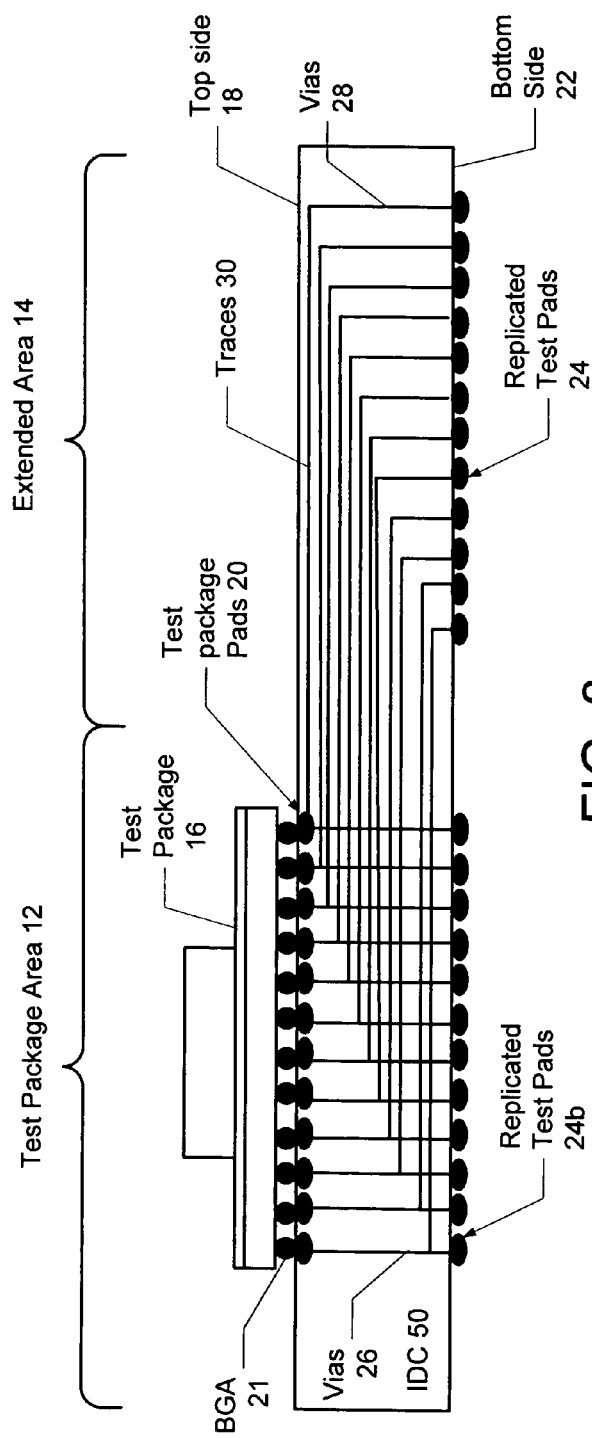
FIGS. 3 and 4 are diagrams illustrating side and top views, respectively of an the IDC according to a second embodiment of the present inventions.
Figure 4:
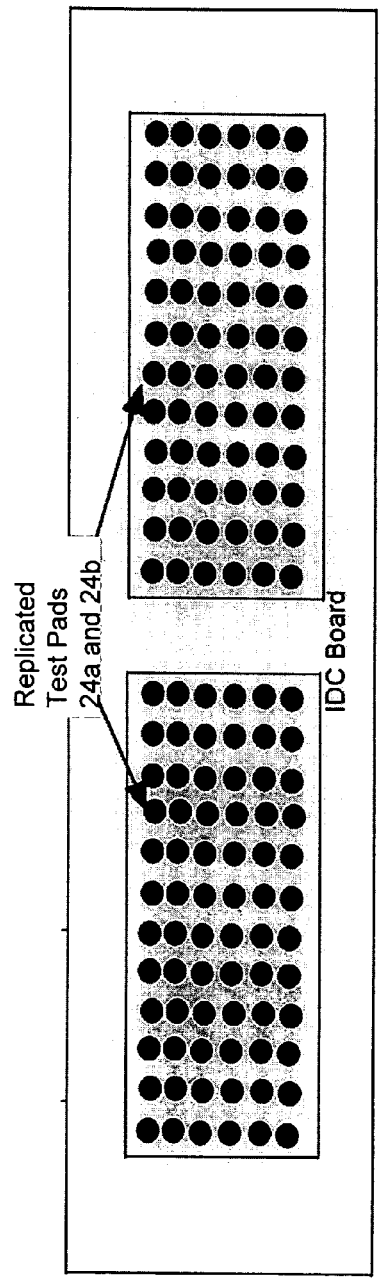

FIGS. 3 and 4 are diagrams illustrating an IDC 50 according to a second embodiment of the present invention, where like components from FIG. 1 have like reference numerals. In the second embodiment, the IDC 50 includes two sets of replicated test pads 24a and 24b. As in the first embodiment, the first set of replicated test pads 24a is located on the bottom side 22 of the IDC 50 horizontally offset from the set of test package pads 20. The second set of replicated test pads 24b, however, is located on the bottom side 22 directly opposite the set of test package pads 20 in the test package area 12 of the IDC. Through vias 26 couple the set of test package pads 20 with the second set of replicated test pads 24b. The second set of replicated pads are preferably used to see if any changes in resistance is caused by a fault in the IDC, rather than in the device or device attached in test. It is also useful for a manual test of the device.

Figure 5:
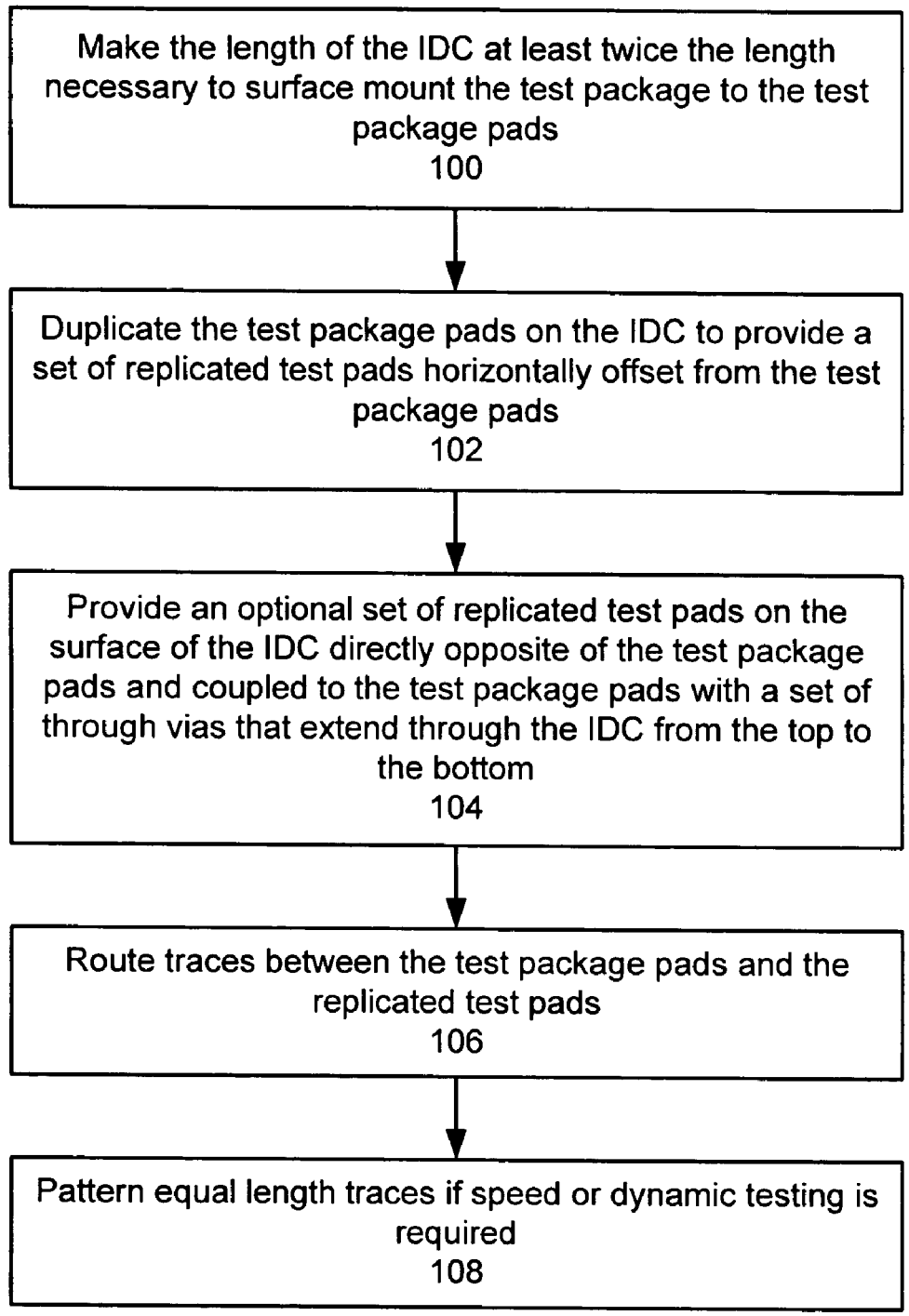
FIG. 5 is a flow diagram illustrating the process for implementing a zero ATE insertion force IDC in accordance with a preferred embodiment of the present invention.

FIG. 5 is a flow diagram illustrating the process for implementing a zero ATE insertion force IDC in accordance with a preferred embodiment of the present invention. The process begins in step 100 by making the length of the IDC 10 at least twice the length necessary to surface mount the test package 16 to the test package pads 20. In step 102, the test package pads 20 are duplicated on the IDC to provide a set of replicated test pads 24a horizontally offset from the test package pads 20. In step 104, an optional second set of replicated test pads 24b is provided on a surface of the IDC directly opposite of the test package pads 20 and coupled to the test package pads 30 with a set of through vias that extend through the IDC from the top to the bottom. In step 106 traces 30 are routed between the test package pads 20 and the replicated test pads 24a. If speed or dynamic testing is required, then in step 108, equal length the traces 30 are patterned. This allows for testing an active device at speed (e.g., testing the device at 100 MHz) and static testing. In addition, the traces 30 within the layers of the IDC 10 maintain the same impedance necessary for performing the test, so the IDC 10 will also require an appropriate number of VDD and VSS planes (not shown).

A zero ATE insertion force interposer daughter card is been disclosed. The present invention has been described in accordance with the embodiments shown, and one of ordinary skill in the art will readily recognize that there could be variations to the embodiments, and any variations would be within the spirit and scope of the present invention. For example, the set of replicated test pads 24a may be located on the same side of the IDC 10 as the set of test package pads 20, or the vias 28 coupled to the center of replicated test pads 24 may be implemented as through vias, rather than vias that terminate between the top and bottom sides of the IDC. Accordingly, many modifications may be made by one of ordinary skill in the art without departing from the spirit and scope of the appended claims.

What is claimed is:

1. A zero insertion-force interposer daughter card (IDC) for use in a test apparatus having a test socket, comprising:
    a test package area containing a set of test package pads for surface mounting I/O's of a test package;
    an extended area adjacent to the test package area having a set of replicated test pads for replicating the test package pads and for removably inserting the IDC into the test socket; and
    traces for coupling the test package pads to the replicated test package pads;
    wherein when the extended area is removably inserted into the test apparatus such that the set of replicated test pads mate with the test socket, an test socket clamp rests on the top side of the extended area to hold the IDC in place, while the test package area is left suspended in air and not disturbed by force imparted by the test socket clamp.

2. The zero insertion-force IDC of claim 1 wherein a first side of the IDC in the test package area includes the test package pads, and a second side of the IDC in the extended are includes the replicated test package pads.

3. The zero insertion-force IDC of claim 2 wherein the traces are coupled between a set of test package vias, which are coupled to respective test package pads, and a set of replicated vias, which are coupled to respective replicated test pads.

4. The zero insertion-force IDC of claim 3 wherein the traces are located within of the IDC.

5. The zero insertion-force IDC of claim 4 wherein the IDC is used with automated testing equipment.

* * * * *